(12) United States Patent
Yeh (10) Patent No.: US 7,785,494 B2
(45) Date of Patent: Aug. 31, 2010

(54) ANISOTROPIC CONDUCTIVE MATERIAL

(75) Inventor: Syh-Tau Yeh, Taoyuan County (TW)

(73) Assignee: Teamchem Company, Bar-der, Taoyuan County (TW)

( * ) Notice: Subject to any disclaimer, the term of this patent is extended or adjusted under 35 U.S.C. 154(b) by 213 days.

(21) Appl. No.: 11/833,238

(22) Filed: Aug. 3, 2007

(65) Prior Publication Data

US 2009/0035553 A1     Feb. 5, 2009

(51) Int. Cl.
   *H01B 1/00*     (2006.01)
   *H01B 1/12*     (2006.01)
   *H01B 1/02*     (2006.01)
   *G03C 1/76*     (2006.01)
   *B32B 5/16*     (2006.01)

(52) U.S. Cl. .................. 252/500; 252/501.1; 252/512; 252/513; 428/323; 428/330; 430/269; 430/270

(58) Field of Classification Search ............. 252/500, 252/501.1, 512–513; 428/323, 330; 430/269, 430/270, 270.1
   See application file for complete search history.

(56) References Cited

U.S. PATENT DOCUMENTS

| 6,184,280 | B1 * | 2/2001 | Shibuta ................. 524/405 |
|---|---|---|---|
| 6,452,476 | B1 | 9/2002 | Handa |
| 6,607,679 | B2 * | 8/2003 | Handa et al. ............. 252/513 |
| 6,669,869 | B2 | 12/2003 | Yamaguchi et al. |
| 6,778,062 | B2 * | 8/2004 | Handa et al. ............. 428/221 |
| 6,812,065 | B1 | 11/2004 | Kitamura |
| 6,827,880 | B2 | 12/2004 | Ishimatsu |
| 6,838,022 | B2 | 1/2005 | Khanna |
| 6,849,335 | B2 | 2/2005 | Igarashi et al. |
| 6,878,435 | B2 | 4/2005 | Paik et al. |
| 6,939,431 | B2 | 9/2005 | Mizuta et al. |
| 7,026,239 | B2 | 4/2006 | Souriau et al. |
| 7,038,327 | B2 | 5/2006 | Ho et al. |
| 7,071,722 | B2 | 7/2006 | Yamada et al. |
| 7,077,659 | B2 | 7/2006 | Weiss et al. |
| 2004/0041683 | A1 * | 3/2004 | Tosaka et al. ............. 338/22 R |

FOREIGN PATENT DOCUMENTS

| EP | 1 832 636 A1 | 9/2007 |
|---|---|---|
| JP | P2004-238483 A | 8/2004 |
| WO | 03/000816 A1 | 1/2003 |

* cited by examiner

*Primary Examiner*—Geraldina Visconti
(74) *Attorney, Agent, or Firm*—Winston Hsu (57) ABSTRACT

Compositions consisting of a mixture of filamentary nickel powder(s) and a thermosetting epoxy resin form the basis of anisotropic conductive materials. The filamentary nickel powder has a three-dimensional chain-like network structure. When such filamentary nickel powder is dispersed in a polymer thin film, such as an epoxy resin, it exhibits anisotropic conductivity.

5 Claims, 8 Drawing Sheets

ANISOTROPIC CONDUCTIVE MATERIAL

BACKGROUND OF THE INVENTION

1. Field of the Invention

The present invention relates to an anisotropic conductive material. More particularly, the present invention relates to a composition of an electrical anisotropic polymer material.

2. Description of the Prior Art

As propelled by consumer preferences, electronic products have become smaller in size, lighter and more compact. It is also required that the electronic products are able to process more information at higher speeds. Consequently, electronic product manufacturers have faced the issue of having to connect electric components at ever increasing precisions.

Although the traditional method of soldering has been proven to be fairly reliable and easy to operate, it has troubles with connecting circuit parts at very fine pitches. Different anisotropic conductive materials, such as anisotropic conductive film (ACF), anisotropic conductive adhesive (ACA) or anisotropic conductive sheet (ACS) have all found some success in resolving this issue.

An anisotropic conductive film is typically used to make permanent or semi-permanent connections between two thin circuit boards or between the integrated circuit chips and the circuit board. For example, ACF may be used in the manufacturing of TFT-LCD for connecting different layers.

An anisotropic conductive film typically consists of conductive particles, such as silver particles or silver-plated organic particles, dispersed in a thermosetting latent-curing epoxy resin system. The anisotropic conductive film is placed between two substrates to be connected, heat and pressure is applied to melt the resin and to force the two substrates close together so that surfaces of the two connecting substrates are both in contact with the conductive particle. Electricity is conducted through the conductive particle and freely flows between the two substrates, but not along the anisotropic conductive film because the conductive particles are just sparsely dispersed to avoid contact with each other.

The operating principle of anisotropic conductive adhesive or anisotropic conductive paste (ACP) is very similar to that of the anisotropic conductive film. As such, it also contains conductive particles sparsely dispersed in a thermosetting polymer matrix. Heat and pressure are also needed for the application of adhesive conductive paste to force the ACP into forming a thin layer of several microns in thickness, so that essentially a single layer of conductive particles is sandwiched between the two connecting substrates, and the conductive particles are in direct contact with the substrate surfaces but not with each other. This ensures electric conductivity along the perpendicular direction of the film but not along directions on the film. Due to its fluid form, the ACP can be applied to the substrate surfaces by screen-printing methods or any other coating methods.

U.S. Pat. No. 7,077,659 B2 filed Jul. 18, 2006 to Weiss et al. discloses an ACS is obtain by mixing magnetic particles with a liquid resin, forming the mix into a continuous sheet and curing the sheet in the presence of magnetic field. This results in particles forming columns through the sheet thickness which are electrically conductive.

U.S. Pat. No. 7,071,722 B2 filed Jul. 4, 2006 to Yamada et al. discloses slightly larger magnetic conductive particles (5-50 μm average diameter), such as iron, nickel, cobalt, or composite particles obtained using nickel as core particles and plating the surfaces with gold or silver, were mixed with liquid silicone rubber containing proper curing reagents. The anisotropic conductive rubber sheet is formed using a sheet-mold in the presence of heat and strong magnetic field.

U.S. Pat. No. 6,849,335 B2 filed Feb. 1, 2005 to Igarashi et al discloses a molding compound containing magnetic conductive particles of slightly smaller particle sizes (1-10 μm average diameters) and a liquid silicone rubberwas sheet molded simultaneously under heat and magnetic fields.

U.S. Pat. No. 6,669,869 B2 filed Dec. 30, 2003 to Yamaguchi et al. discloses winding a copper wire coated with an insulating polymer into a anisotropic conducting block of multiple winding layers, and then sliced the block into thin layers of anisotropic conducting sheet.

U.S. Pat. No. 6,878,435 B2 filed Apr. 12, 2005 to Paik et al. reveals a triple-layered anisotropic conductive adhesive film based on the above-mentioned concept of sparsely dispersed conductive particles. The triple-layered configuration is meant to enhance the adhesion of ACA film. Therefore two adhesion reinforcement layers are added to the top and bottom surfaces of the main ACA film. The main ACA film is 25-50 μm in thickness, having 5-20% by weight of conductive particles of 3-10 μm in particle diameter. The adhesion reinforcement layers containing 5-10% by weight of conductive particles are 1-10 μm thick.

U.S. Pat. No. 6,939,431 B2 filed Sep. 6, 2006 to Mizuta et al. discloses an anisotropic conductive paste composition. Conductive particles made of noble metals such as gold, nickel, silver or platinum, and organic fine particles coated by nickel and gold are examples. Thermosetting resin consisting of an epoxy resin with acid anhydride and phenolic resin as curing agent, plus appropriate catalyst, de-foamer and other necessary additives formed the base polymer. High softening point particles of acrylates and silicone elastomer are added. The weight of conductive particles is 2-15% of the total weight, and is only 5% of the total weight in most of the examples.

U.S. Pat. No. 6,838,022 B2 filed Jan. 4, 2005 to Khanna discloses an anisotropic conductive compound comprising magnetic conductive particles, such as nickel, blended with thermosetting epoxy resin. This compound needs to be thermally cured under a magnetic field. Pre-sealing by a UV-curable resin is required. The disclosed procedures are not practical.

U.S. Pat. No. 6,827,880 B2 filed Dec. 7, 2004 to Ishimatsu discloses an anisotropic conductive adhesive consisting of peroxide-cured vinyl ester resin compound and conductive particles, which is claimed to have good adhesion and environmental durability.

U.S. Pat. No. 6,812,065 B1 filed Nov. 2, 2004 to Kitamura discloses an anisotropic conductive paste consisting of a conductive particle having a specific size, a thermosetting epoxy resin, a rubber particle and a high softening point polymer particle.

SUMMARY OF THE INVENTION

It is one object of the present invention to provide an improved polymer material for the applications of anisotropic conductive adhesives, anisotropic conductive films or sheets.

According to the claimed invention, a composition of anisotropic conductive material comprises a base resin system comprising an epoxy resin, a hardener and a catalyst; and a filamentary nickel powder dispersed in the base resin system, wherein the filamentary nickel powder has a characteristic three-dimensional, chain-like network of extra fine particles. In another embodiment, the composition of anisotropic conductive material further comprises a de-foamer and a thixotropic reagent.

The filamentary nickel powder acts as an essential conductive component in an anisotropic conductive adhesive, film or sheet. The filamentary nickel powder (2-50% by weight) is dispersed in a thermosetting epoxy resin. The result is an anisotropic conductive material that displays better anisotropic conductivity.

Unlike most of the present commercial anisotropic conductive film products which need to be hot pressed to a film thickness equal to the diameter of the conductive particle, this invention provides an anisotropic conductive adhesive that is functional even when the final adhesive film thickness is several times greater than the diameter of the conductive particle. Because of that, it can provide anisotropic conductivity under a much wider operation window.

The filamentary nickel powder is an aggregate of smaller spiked spherical particles having particle sizes ranging between 0.2-0.5 microns. The sizes of the aggregates are difficult to measure due to their irregular physical contours, but are estimated to be in the range of 10-50 microns in general.

The base epoxy system consists of an epoxy resin or a blend of epoxy resins with appropriate cuing system that consists of hardener(s) and catalyst(s). Acid anhydride was found to be a very effective hardener for this type of application.

The epoxy resin reacted with acid anhydride has been found to possess superior chemical and thermal resistance. It also has excellent adhesion to almost any substrate due to its slow but progressive reaction. Tertiary amines such as tetrabutyl ammonium bromide or triphenyl phosphine are all effective catalyst for the epoxy resin-acid anhydride curing system.

Some melamine-formaldehyde resins catalyzed by 0.2-1.5% p-toluene sulfonic acid are also effective curing system for this application. Phenolic resins catalyzed by tertiary amines such as tetra butyl ammonium bromide or tri-phenyl phosphine also work. Many imidazoles that can function as hardener and catalyst at the same time are also effective curing systems.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
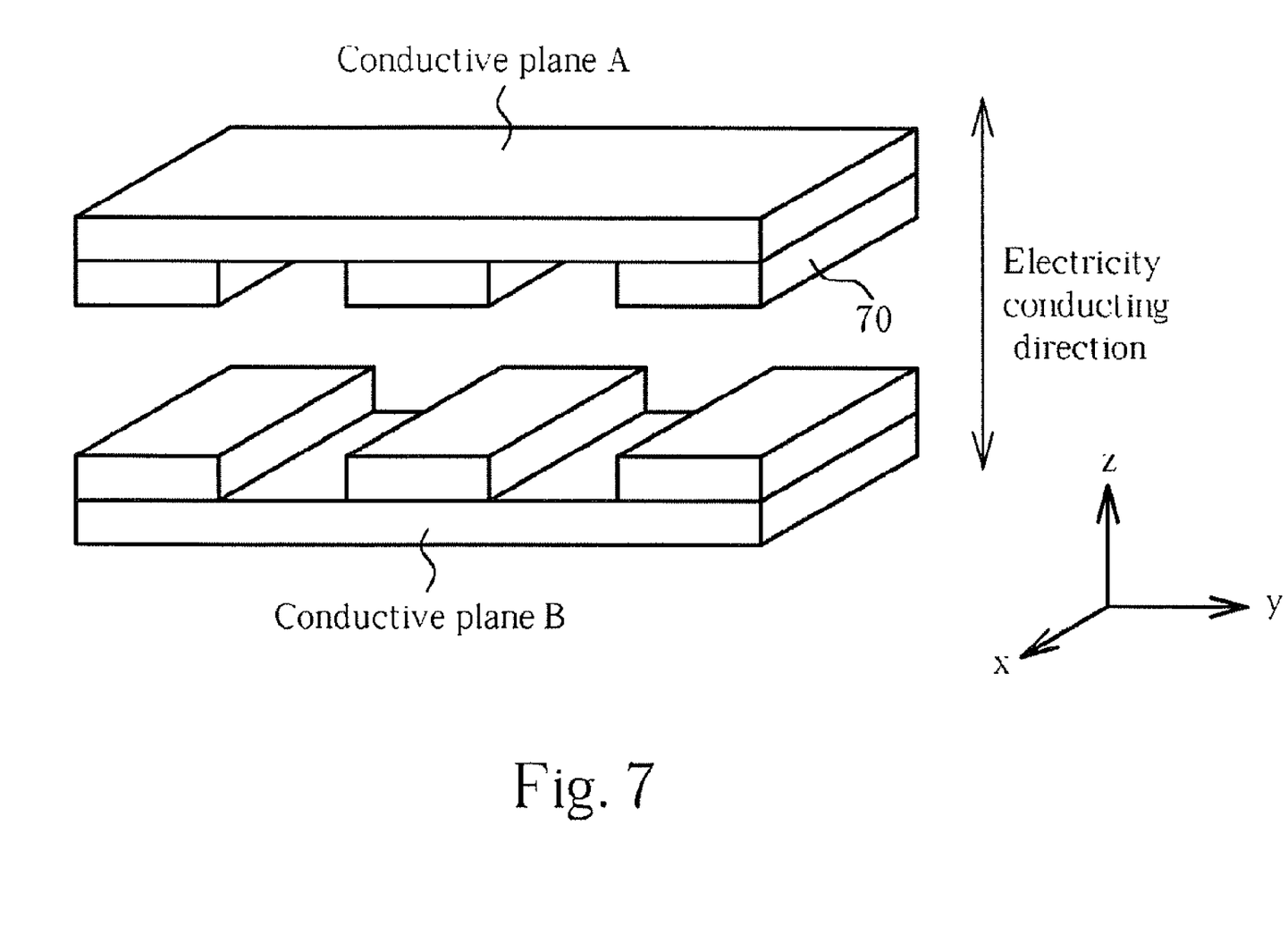
FIG. 7 demonstrates reference x-, y- and z-coordinate system and the conductive planes.

The present invention relates to an anisotropic conductive material that can be applied to bond two electronic components or two conductive surfaces/planes together. The anisotropic conductive material allows electricity to be conducted only in z-direction (or in thickness direction), but not along x- and y-directions (x- and y-directions are parallel to the substrate surfaces to be bonded together, and z-direction is perpendicular to the substrate surfaces). The aforesaid reference x-, y- and z-coordinate system and the conductive planes are demonstrated in FIG. 7. As shown in FIG. 7, the anisotropic conductive material (not explicitly shown) is filled between the conductive plane A and conductive plane B with bumps 70 therebetween.

A filamentary nickel powder dispersed in a thermosetting epoxy resin forms the basis of an anisotropic conductive material system. Various forms of the anisotropic conductive materials, such as anisotropic conductive film (ACF), anisotropic conduct adhesive (ACA), etc. can be derived from this basic composition of this invention.

This anisotropic conductive material can be processed to form an anisotropic conductive adhesive (ACA) that is capable of permanently bonding two electronic components together. Or, it can also be formulated into a one-component latent cuing system, which is coated onto a release liner and then dried to form a thermosetting anisotropic conductive film (ACF). When this anisotropic conductive film (ACF) is thermally cured, it becomes an anisotropic conductive sheet (ACS).

At present, the use of anisotropic conductive adhesive films in the TFT-LCD industries for connecting fine pitches is a pretty common practice. Generally, most commercially available ACF products used for this purpose are composed of conductive particles of 2-5 μm in diameter and a latent-curing thermosetting epoxy resin. The conductive particles are typically polymeric sphere with Ni/Au overcoat or pure, spherical nickel. In some cases, a thin insulating polymer is coated on the Ni/Au overcoat to form a multiple-layered spherical structure. The polymeric sphere with Ni/Au overcoat is expensive.

For the ACF to function properly, the requirements for highly uniform particle size distribution of the conductive particles is very strict. Ordinarily, the particle size variation has to be within several tenths of a micron. Otherwise, it could lead to inefficient utilization of the conductive particles and causing low conductivities.

Figure 1:
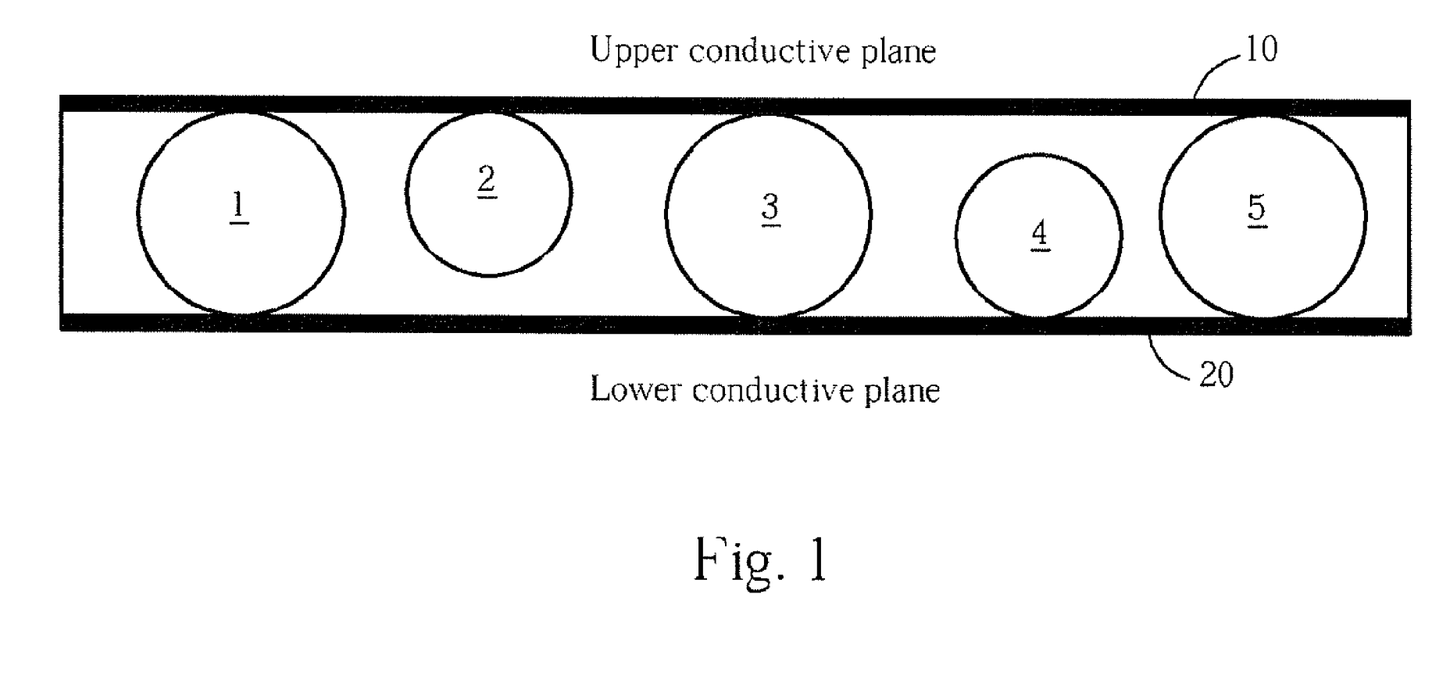
FIG. 1 illustrates conductive spherical particles of different sizes of an anisotropic conductive film sandwiched between two conductive planes.

The problem of particle size variations is illustrated in FIG. 1 wherein an ACF containing conductive particles of different sizes is sandwiched between two parallel conductive planes 10 and 20. As specifically indicated in this figure, the smaller particles 2 and 4 fail to connect the two conductive planes, resulting in decreased electric conductivity.

Moreover, these ineffective, smaller particles make it more likely to conduct electricity in substrate plane direction (i.e., the direction perpendicular to the thickness direction), which is undesirable. Therefore, it is important to have conductive particles of substantially equal size so that they can conduct electricity in the direction perpendicular to the substrate plane, which, however, is very difficult to achieve.

Figure 2:
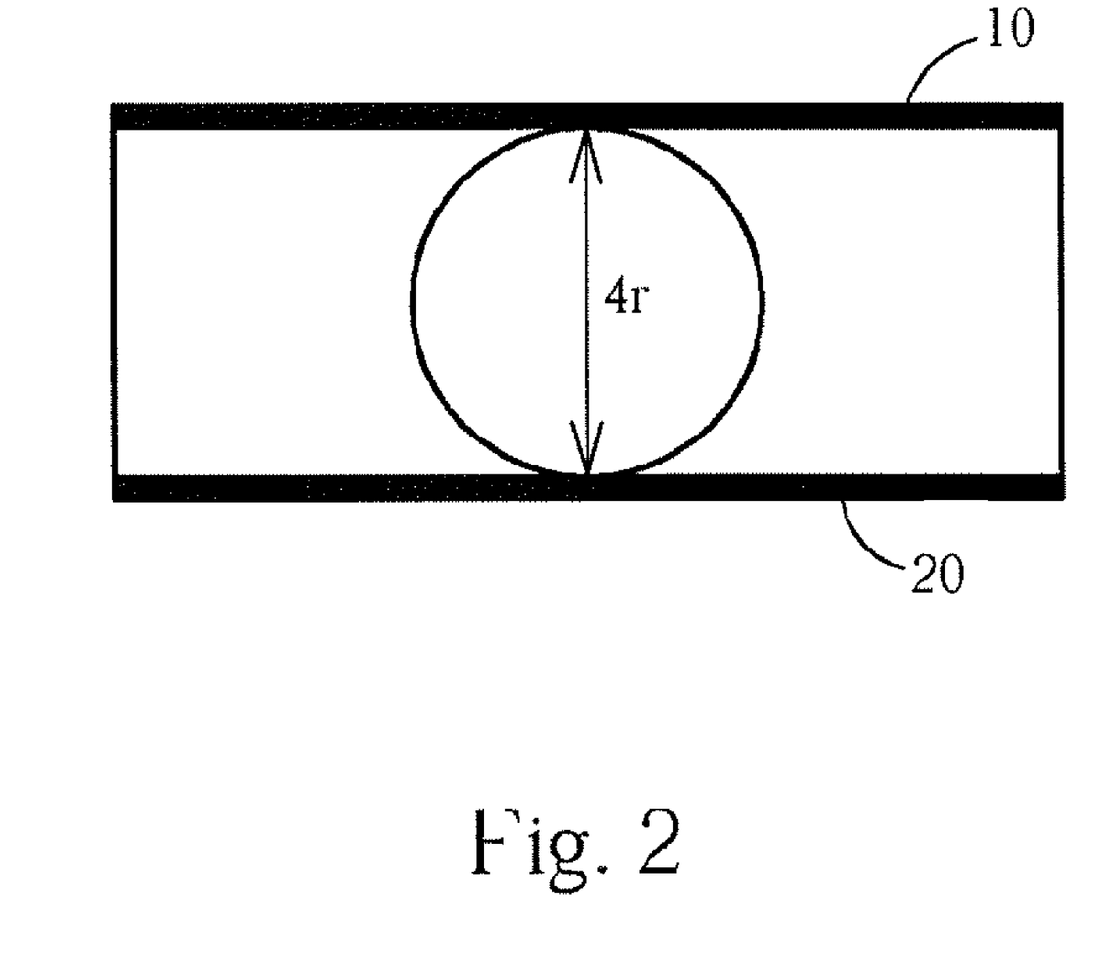
FIG. 2 shows one conductive particle with a radius of 2r of an anisotropic conductive film, which is sandwiched between two conductive planes, wherein the thickness of the anisotropic conductive film is 4r.
Figure 3:
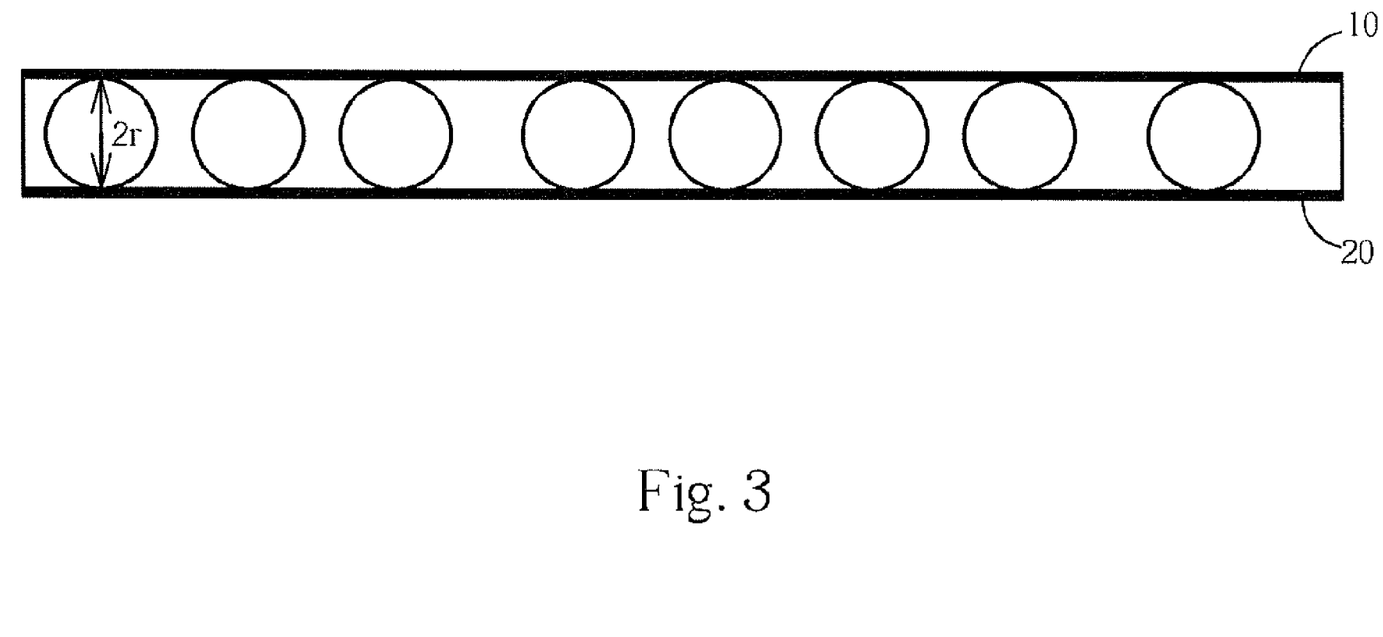
FIG. 3 illustrates eight smaller conductive, spherical particles with a radius of r, which are dispersed and sandwiched between two conductive planes, wherein the distance between the two conductive planes is 2r.

In addition to particle size distribution discussed above, particle size itself plays an even more important role in anisotropic conductivity. This can be illustrated by using one conductive, spherical particle with a radius of 2r (diameter=4r) sandwiched between two parallel conductive planes 10 and 20, as shown in FIG. 2. This particle forms two contact points with the upper and the lower conductive planes 10 and 20. Assuming this particle can be divided into eight smaller equal particles with radius of r, as illustrated in FIG. 3. The eight smaller particles, in combination, have about the same volume as one larger particle of twice the radius, but forms sixteen contact points with the two conductive planes 10 and 20.

Although the combined volume of these eight smaller particles of FIG. 3 is the same as that of the larger particle of FIG. 2, the smaller particles are able to create more contact points with the conductive planes. This suggests that the conductivity of the smaller particles could be eight times as much as that of the larger particle. Careful evaluation reveals this may be an exaggeration, because it did not take into account of the curvature of the particle. The larger particle, with a smaller curvature, should be able to form a larger contact area with the conductive plane. Realistically, the conductivity is expected to be proportional to the specific surface area of the conductive particle and inverse proportional to the particle diameter. This can be expressed mathematically as:

$$G \propto A_S \propto D^{-1} \qquad \text{(eq. 1)}$$

G: Electric conductivity $A_S$: Specific surface area of the conductive particle D: Diameter of the conductive particle Apparently, using smaller conductive particles helps conductivity, but there is also a problem associated with this. Smaller particles mean smaller gap between the conductive planes. This would not be a problem if the gap can be maintained constant. In real situations, however, a constant gap may be difficult to achieve. In that case, the reduced gap can present a problem.

Taking into the consideration that the larger particle could perhaps have a somewhat larger contact area, the more numerous smaller particles are still expected to conduct electricity better because of more contact points made with the conductive planes. On the other hand, the gap between the two conductive planes has to be reduced to 2r from 4r in order to achieve that.

Figure 4:
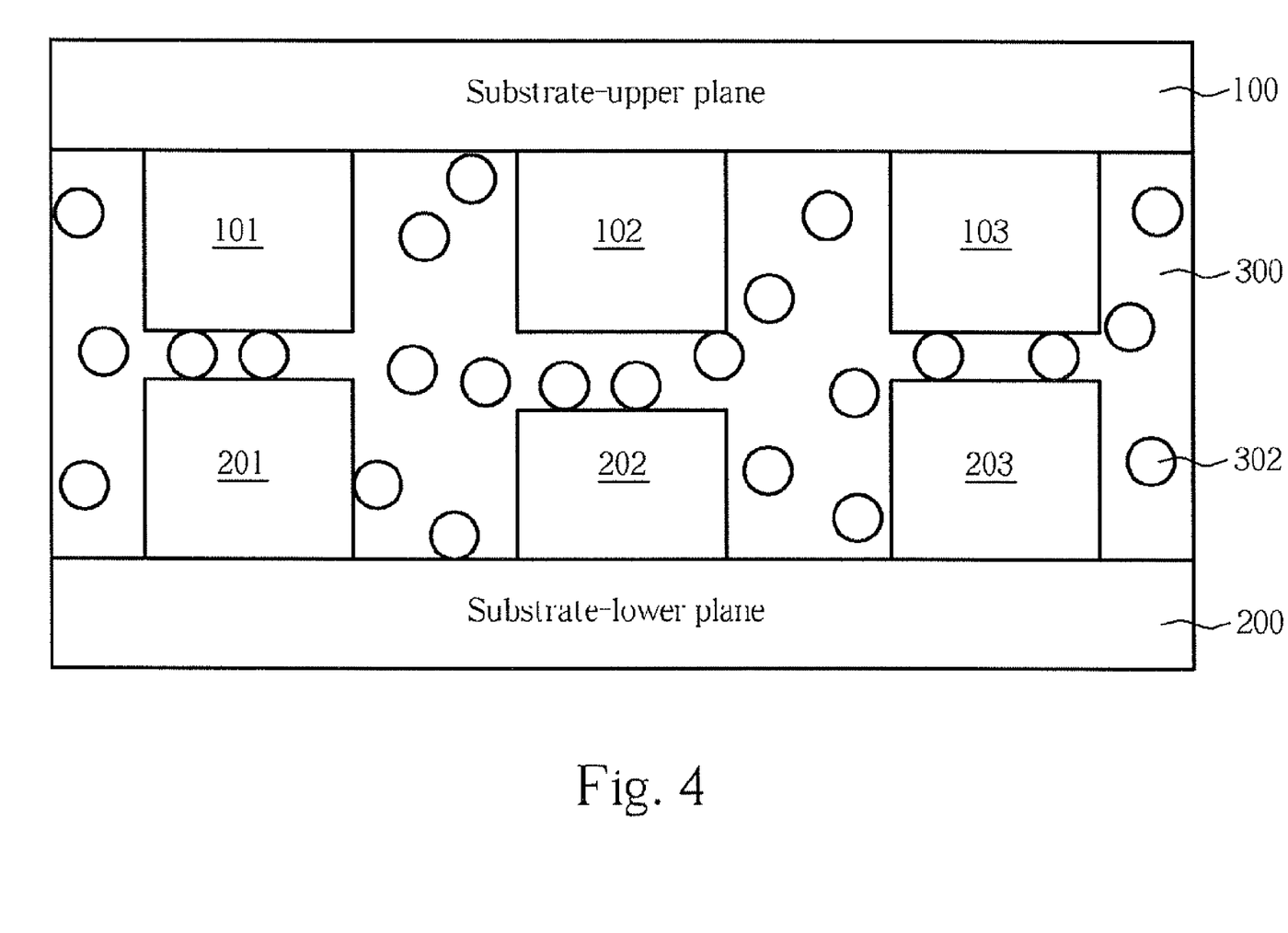
FIG. 4 illustrates two substrate surfaces, bumps between the two substrate surfaces, ACF and conductive, spherical particles dispersed in the ACF.

However, from one aspect, the reduced gap distance may be a problem when there is an uneven gap distribution between the two connected substrate surfaces 100 and 200 as illustrated in FIG. 4. FIG. 4 illustrates two substrate surfaces 100 and 200 such as an ITO substrate or a glass substrate, bumps 101, 102, 103, 201, 202 and 203 thereof between the two substrate surfaces, ACF 300 bonding the two substrate surfaces 100 and 200 and conductive, spherical particles 302 dispersed in the ACF 300.

As shown in FIG. 4, the conductive, spherical particles 302 fail to electrically connect the two bumps 102 and 202 in the middle because of a relatively larger gap between the two bumps 102 and 202. The two bumps 102 and 202 fail to connect with each other because bump 202 is slightly lower than the others, resulting in a slightly larger gap between bumps 102 and 202. This increased gap makes it impossible to have good contacts between the conductive particles and the conductive planes 100 and 200, resulting in failed electric conductivity. Therefore, using smaller conductive particles can increase conductivity, but it also raises the possibility of conduction failure.

One can conclude that reducing the particle size helps to increase conductivity but at the cost of higher possibility of conduction or connection failure between two bumps.

According to one preferred embodiment of this invention, a filamentary powder is utilized to replace conventional spherical conductive particles as one major component of an anisotropic conductive material, which is capable of solving the above-mentioned problems. According to one preferred embodiment of this invention, the filamentary powder of 2-50 wt. % is dispersed in a thermosetting epoxy resin. The result is a material that exhibits improved anisotropic conductivity.

According to this invention, the filamentary powder has a characteristic three-dimensional, chain-like network of extra fine particles. More specifically, the filamentary powder consists of filamentary aggregates of fine particles in a fused fashion. Each of the fine particles has a spiked, spherical structure and a very small particle size ranging between 0.2-0.5 μm.

The sizes of the aggregates are difficult to measure due to their irregular physical contours, but are estimated to be in the range of 5-50 μm in general. Preferable examples of the filamentary powder include, but not limited to, Inco® nickel power Type 210, 210H, 240 and 255.

Figure 5:
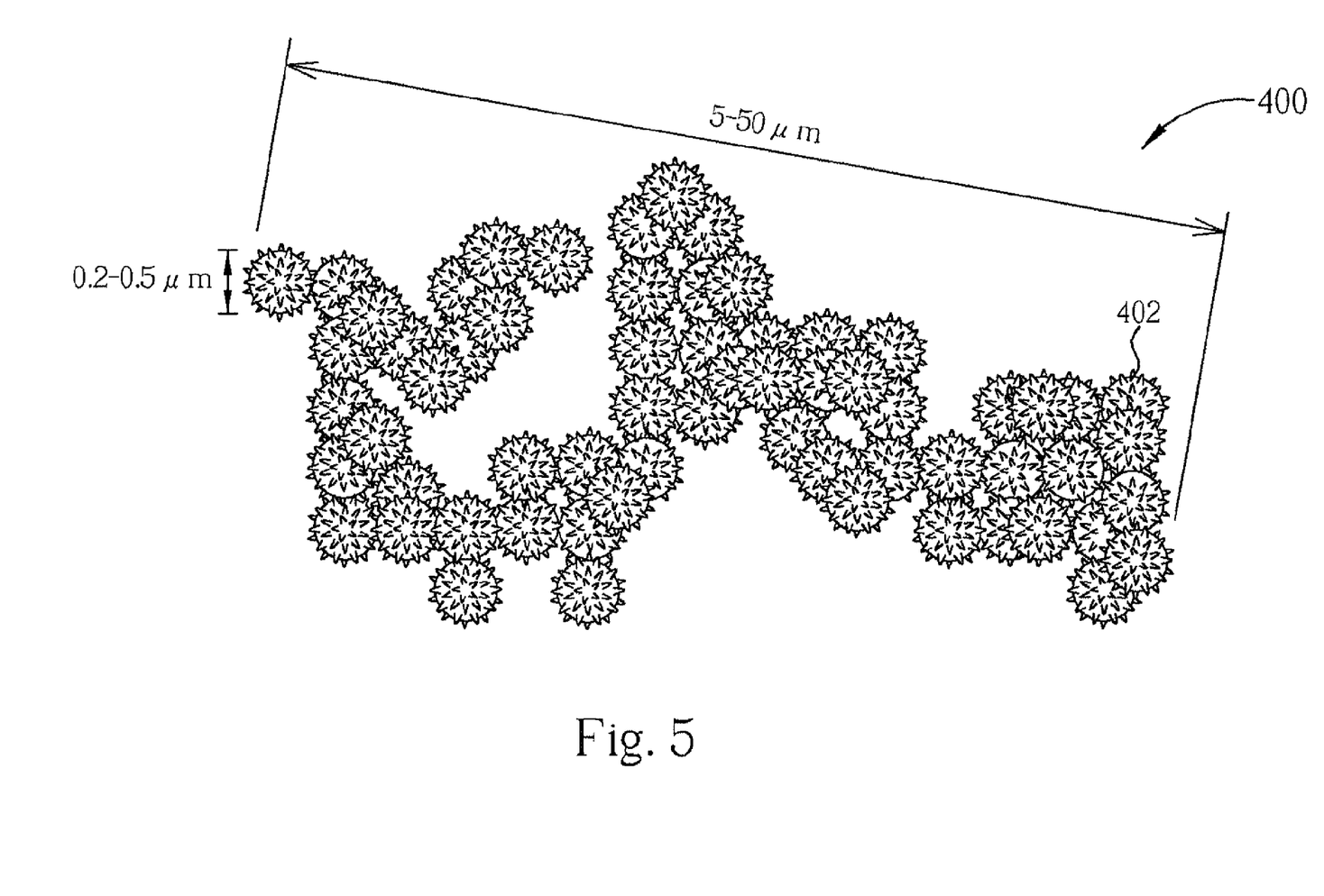
FIG. 5 is a schematic diagram showing one single filamentary aggregate unit of the filamentary nickel powder according to this invention.

FIG. 5 is a schematic diagram showing one single filamentary aggregate unit 400 of the filamentary nickel powder. The filamentary aggregate unit 400 consists of fused fine particles 402 (primary particles). Each of the fine particles 402 has a dimension of several tenth of a micron. The filamentary aggregate unit 400 (or secondary particle) has a dimension of greater than several microns. The porous structure can be crushed and deformed when being subjected to the pressure from a hot press, thus creating better contact with the conductive planes. This in terms leads to better electric conductivity and lowered electric resistance.

Unlike the present commercial anisotropic conductive films, which need to be hot pressed to a film thickness equal to the diameter of the conductive particle, this invention provides an anisotropic conductive adhesive or film that is functional even when the final film thickness is greater than 5 microns. Because of that, it can provide anisotropic conductivity under a much wider operation window.

As previously mentioned, the filamentary nickel powder has a three-dimensional chain-like structure created by the fusion of many small nickel primary particles. The primary nickel particles can be viewed as spiked spheres with diameters ranging from 0.2 μm to 0.5 μm. They fuse together to form a physically unbreakable secondary structure of aggregates (powders), which are irregular in shapes and sizes. These filamentary nickel powders (or aggregates) are porous by nature, allowing them to be compressed under a pressing force.

This compressibility is a major factor that distinguishes it from the other type of conductive particles, i.e. various types of conductive spherical particles. Although many of the metal-coated polymeric conductive spheres also have some compressibility, they are by no means as compressible as the filamentary nickel powders.

Figure 8:
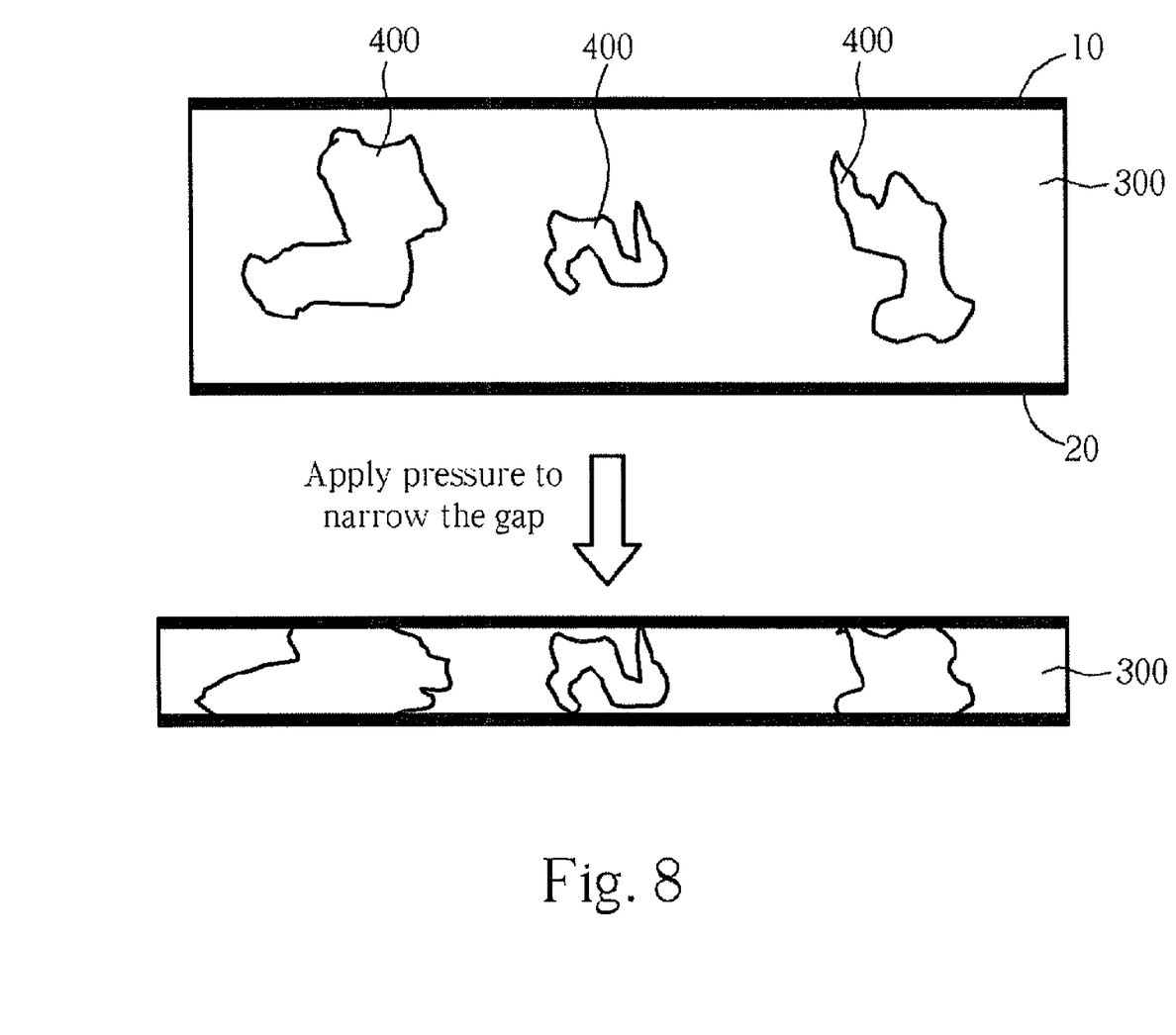
FIG. 8 illustrates the compression of an anisopic conductive material provided by this invention, where good electric contacts can be created despite irregularities of their particle sizes and shapes with the filamentary conductive nickel powder.

The compressibility of the filamentary nickel powder is analogous to that of puffed popcorns. It means that they can be easily compressed and deformed under pressure, creating better contacts with the conductive planes 10 and 20, resulting in better electric conductivity. A schematic drawing illustrating this phenomenon is shown in FIG. 8. FIG. 8 also shows that the variability in the original shapes and sizes of these filamentary nickel powders 400 dispersed in the ACF 300 is less an issue because these powders 400 can be compressed and deformed to fit in the gap.

There is also a second factor for the filamentary nickel powder to be a better anisotropic conducive particle, and that is their relatively small primary particle. Because the primary particles of the filamentary nickel powders are relatively small (0.2-0.5 μm for these versus 2-5 μm for traditional conductive spheres in particle diameters), the specific surface area of the filamentary nickel powders should be around ten times that of the traditional conductive spheres. This means a ten-fold increase of the electric conductivity for the filamentary nickel powders.

Additionally, the filamentary nickel powders are also commercial products that are readily available and relatively inexpensive. Examples of commercially available filamentary nickel powder are such as Inco® Type 210, 210H, 240 and 255.

Application of the filamentary nickel powder is provided by this invention to be a solution for prior art problems. By applying the filamentary nickel powder, the present invention anisotropic conductive adhesive, anisotropic conductive film or anisotropic conductive sheet can be applicable to the bonding of two substrate surface with very small gaps and provides higher anisotropic conductivity.

Figure 6:
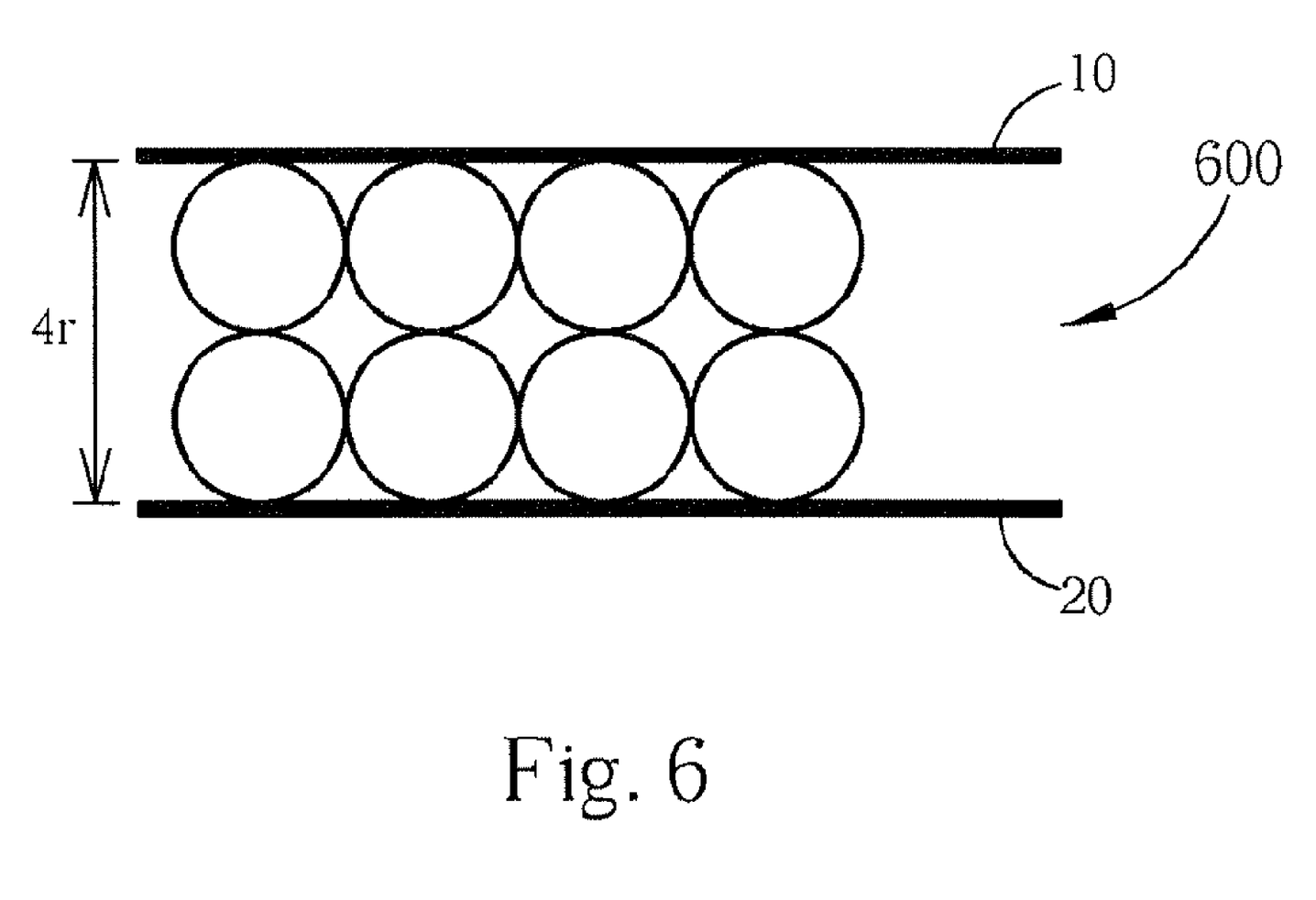
FIG. 6 illustrates a dual-layer filamentary aggregate unit comprising eight fine primary particles between the two conductive planes.

The reason why this works is demonstrated in FIG. 6 wherein eight fine primary particles form a dual-layer filamentary aggregate unit 600. In this case, theoretically, each secondary particle is able to form four contact points each with the conductive planes. This results in a four-fold increase of the conductivity, but with no change in the gap distance (gap distance is 4r, like FIG. 2).

As previously mentioned, the electrical conductivity is proportional to the particle surface area or inversely proportional to the particle diameter, because higher surface area means higher probability of contact with the conductive planes.

Therefore, using the smaller primary particles with larger surface areas improves the electrical conductivity. The effective gap distance between the connected substrates, however, is only affected by the size of the filamentary aggregate unit or secondary particle. To have larger aggregate of many smaller primary particles means high anisotropic conductivity can be achieved with no need to have very small connected substrate gaps.

According to this invention, the thermosetting epoxy resin consists of an epoxy resin or a blend of epoxy resins with appropriate cuing system that consists of hardener(s) and catalyst(s). Acid anhydride was found to be a very effective hardener for this type of application. The epoxy resin that reacts with acid anhydride has been found to possess superior chemical and thermal resistance. It also has excellent adhesion to almost any substrate due to its slow but progressive reaction.

Tertiary amines such as tetrabutyl ammonium bromide or triphenyl phosphine are all effective catalyst for the epoxy resin-acid anhydride curing system. Some melamine-formaldehyde resins catalyzed by 0.2-1.5 wt. % p-toluene sulfonic acid are also effective curing system for this application.

Phenolic resins catalyzed by tertiary amines such as tetra butyl ammonium bromide or tri-phenyl phosphine also work very nicely. Many imidazoles that can function as hardener and catalyst at the same time are also effective curing systems.

Among the other anisotropic conductive materials, anisotropic conductive sheet (ACS) is the simplest in concept, although it might be the most difficult to put into manufacturing practice. It is usually used for making temporary electric connections, such as connecting IC chips to an electric circuit board for testing purposes.

According to one preferred embodiment of this invention, an anisotropic conductive material composition comprises a filamentary nickel powder such as Inco® nickel power Type 210, 210H, 240 or 255 dispersed in a thermosetting epoxy resin.

The amount of the filamentary nickel powder is 2-50% on the basis of the weight of the mixture. The thermosetting epoxy resin system is composed mainly of epoxy resin(s), hardener(s) and appropriate catalyst(s). Other suitable additives, such as de-foamer(s), thixotropic reagent(s) may be added to the thermosetting epoxy resin system when needed.

The epoxy resin(s) may be Bisphenol-A, Bisphenol-F, Phenolic, Novolac or any other modified epoxy resins. Flexible epoxy resins, such as CVC Specialty Chemicals Hypox DA-323 (Dimer Acid Adducted to an Epoxidized Bisphenol A Resin), Dow Chemicals XZ92466.00 or XZ92465.00 have all been found to contribute to better adhesion, therefore are preferably used in the examples for this invention.

Among the various hardeners for epoxy resins, acid anhydrides are particularly useful. Their slower reactions with epoxy resins contribute to better adhesion. Common acid anhydrides, such as Methyl Tetrahydrophthalic Anhydride, Methyl Hexahydrophthalic Anhydride, Hexahydrophthalic Anhydride, Succinic Anhydride, etc. have all been found useful.

Succinic Anhydride, due to its more flexible nature of molecules, tends to contribute to better adhesion, thus is preferably used in the examples for this invention. Catalyst that has been found to be effective in the cuing of acid anhydrides and epoxy resins includes tertiary amines, such as Tetra Butyl Ammonium Bromide (TBAB), Triphenyl Phosphine, etc.

Table 1 demonstrates four examples of two-part anisotropic conductive adhesives using filamentary nickel powders and epoxy resins cured by acid anhydrides. These examples are illustrated here to demonstrate the basic concept of this invention, and they are by no means meant to be restrictive. Ingredients 1-7 are weighed, mixed and milled by 3-roll mill. Ingredients 8-9 are added to the milled ingredients of 1-7, and then dispersed by a high-speed agitator. Ingredients 10-11 are acid-anhydride hardeners, which are added right before application.

TABLE 1

| No. | Ingredients | Example 1 | Example 2 | Example 3 | Example 4 |
|---|---|---|---|---|---|
| 1 | Epoxy Resin DA-323* | 100.0 | 100.0 | 100.0 | 100.0 |
| 2 | Dipropylene Glycol Monomethyl Ether (DPM) | 35.0 | 35.0 | 35.0 | 35.0 |
| 3 | De-foamer: TSA-750S** | 2.5 | 2.5 | 2.5 | 2.5 |
| 4 | Triphenyl Phosphine | 0.6 | 0.6 | 0.0 | 0.0 |
| 5 | Tetra Butyl Ammonium Bromide (TBAB) | 0.0 | 0.0 | 0.6 | 0.6 |
| 6 | Fumed Silica Aerosil R974 | 3.5 | 3.5 | 3.5 | 3.5 |
| 7 | Fumed Silica Aerosil A380 | 3.5 | 3.5 | 3.5 | 3.5 |
|  | Sum | 145.0 | 145.0 | 145.0 | 145.0 |

Ingredients 1-7 are weighed, mixed and milled by 3-roll mill.

| No. | Ingredients | Example 1 | Example 2 | Example 3 | Example 4 |
|---|---|---|---|---|---|
| 8 | Filamentary Nickel Powder: Inco Type 210 | 25.0 | 25.0 | 25.0 | 25.0 |
| 9 | Dipropylene Glycol Monomethyl Ether (DPM) | 15.0 | 15.0 | 15.0 | 15.0 |

TABLE 1-continued

| No. | Ingredients | Example 1 | Example 2 | Example 3 | Example 4 |
|---|---|---|---|---|---|
|  | Sum | 185.0 | 185.0 | 185.0 | 185.0 |

Ingredients 8-9 are added to the milled ingredients of 1-7, and then dispersed by a high-speed agitator.

| No. | Ingredients | Example 1 | Example 2 | Example 3 | Example 4 |
|---|---|---|---|---|---|
| 10 | Dodecenyl Succinic Anhydride (DDSA) | 25.0 | 0.0 | 25.0 | 0.0 |
| 11 | Methyl Hexahydrophthalic Anhydride (MHHPA) | 0.0 | 20.0 | 0.0 | 20.0 |
|  | Sum | 210.0 | 205.0 | 210.0 | 205.0 |

Ingredients 10-11 are acid-anhydride hardeners. They are added right before application.
All in parts per hundred parts (phr) by weight.
*Dimer Acid Adducted to an Epoxidized Bisphenol A Resin; CVC Specialty Chemicals.
**silicone-based defoamer; GE-Toshiba.

In addition to acid anhydrides, other epoxy resin hardeners, such as melamine-formaldehyde resins, phenolic resins, imidazoles, etc. have all been used successfully in the composition anisotropic adhesives. Melamine-formaldehyde resins are particularly useful in the formulation of one-pot latent curing system due to its excellent storage stability.

Examples of this can be found in examples 5-6 as demonstrated in Table 2, wherein toluene sulfonic acid is the catalyst that can also be stored separated, but mixed-in with the other ingredients right before the actual application. The storage stability can be improved. Ingredients 1-6 are weighed, mixed and milled by 3-roll mill. Ingredients 7-10 are added to the milled base of 1-6, and then dispersed by a high-speed agitator.

TABLE 2

| No. | Ingredients | Example 5 | Example 6 |
|---|---|---|---|
| 1 | Epoxy Resin DA-323* | 100.0 | 30.0 |
| 2 | Dow Epoxy Resin XZ92465.00 | 0.0 | 70.0 |
| 3 | Dipropylene Glycol Monomethyl Ether (DPM) | 35.0 | 10.0 |
| 4 | De-foamer: TSA-750S** | 2.0 | 2.0 |
| 5 | Fumed Silica Aerosil R974 | 3.0 | 3.0 |
| 6 | Fumed Silica Aerosil A380 | 3.0 | 3.0 |
|  | Sum | 143.0 | 118.0 |
| 7 | Filamentary Nickel Powder: Inco Type 210 | 10.0 | 10.0 |
| 8 | Dipropylene Glycol Monomethyl Ether (DPM) | 5.0 | 5.0 |
| 9 | Melamine-formaldehyde resin Cymel-1158*** | 25.0 | 45.0 |
| 10 | Toluene Sulfonic Acid**** | 1.0 | 1.0 |
|  | Sum | 184.0 | 179.0 |

Ingredients 1-6 are weighed, mixed and milled by 3-roll mill.
Ingredients 7-10 are added to the milled base of 1-6, and then dispersed by a high-speed agitator.
All in parts per hundred parts (phr) by weight.
*Dimer Acid Adducted to an Epoxidized Bisphenol A Resin; CVC Specialty Chemicals.
**silicone-based defoamer; GE-Toshiba.
***n-butylated high amino resin; Cytec Industries.
****Toluene sulfonic acid is the catalyst. It can also be stored separated, but mixed-in with the other ingredients right before the actual application. The storage stability can be improved.

Those skilled in the art will readily observe that numerous modifications and alterations of the device and method may be made while retaining the teachings of the invention.

What is claimed is:

1. A composition of anisotropic conductive material, comprising:
    a thermosetting epoxy resin system; and
    a conductive, filamentary powder dispersed in the thermosetting epoxy resin system, wherein the conductive, filamentary powder has a characteristic three-dimensional, chain-like network structure which is created by fusion of a plurality of extra fine primary particles having a weight percentage in a range of from 2% to 50%.

2. The composition of anisotropic conductive material according to claim 1 wherein the conductive, filamentary powder is filamentary nickel powder consisting of aggregates of the extra fine primary particles, and wherein each of the extra fine primary particles has spiked spherical structure having particle sizes ranging from 0.2-0.5 μm.

3. The composition of anisotropic conductive material according to claim 1 wherein the thermosetting epoxy resin system comprises epoxy resin or blends of epoxy resins mixed with hardener, wherein the epoxy resin is selected from a group consisting of Bisphenol-A, Bisphenol-F, Phenolic, Novolac, modified epoxy resins, flexibilized epoxy resins, and Dimer Acid Adducted Bisphenol-A epoxy resins.

4. The composition of anisotropic conductive material according to claim 3 the hardener is selected from a group consisting of acid anhydride, imidazole, and modified amine.

5. The composition of anisotropic conductive material according to claim 1 wherein the conductive, filamentary powder is sparsely dispersed in the thermosetting epoxy resin system so that anisotropic conductivity can be formed and isotropic conductivity can be avoided.

* * * * *